United States Patent [19]

McAlpine

[11] Patent Number: 4,800,535
[45] Date of Patent: Jan. 24, 1989

[54] INTERLEAVED MEMORY ADDRESSING SYSTEM AND METHOD USING A PARITY SIGNAL

[75] Inventor: Gary L. McAlpine, Beaverton, Oreg.

[73] Assignee: Aptec Computer Systems, Inc., Portland, Oreg.

[21] Appl. No.: 43,840

[22] Filed: Apr. 28, 1987

[51] Int. Cl.$^4$ .................. G11C 8/00; G06F 11/10; H03M 13/00
[52] U.S. Cl. .................. 365/230; 365/200; 371/50; 364/200
[58] Field of Search .................. 365/201, 230, 200; 364/200 MS File, 900 MS File; 371/21, 49, 50

[56] References Cited

U.S. PATENT DOCUMENTS 4,245,344  1/1981  Richter .................. 371/49
4,366,539  12/1982  Johnson et al. .................. 364/200 X Primary Examiner—Stuart N. Hecker
Assistant Examiner—Alfonso Garcia
Attorney, Agent, or Firm—William A. Birdwell

[57] ABSTRACT

A high performance interleaved memory addressing system and method. A plurality of banks of random access memory devices are provided. The appropriate bank for a given memory address is selected based upon the parity among a preselected set of address bits including the least significant bit. A parity signal for selection of a memory bank is produced by a parity signal generation circuit, preferably a logic circuit. Typically, more than two memory banks would be employed, utilizing at least two parity signal generation circuits, each corresponding to respective least significant bits of the memory address. The output signals from the parity circuits are combined in a decoder to select the memory bank.

5 Claims, 2 Drawing Sheets

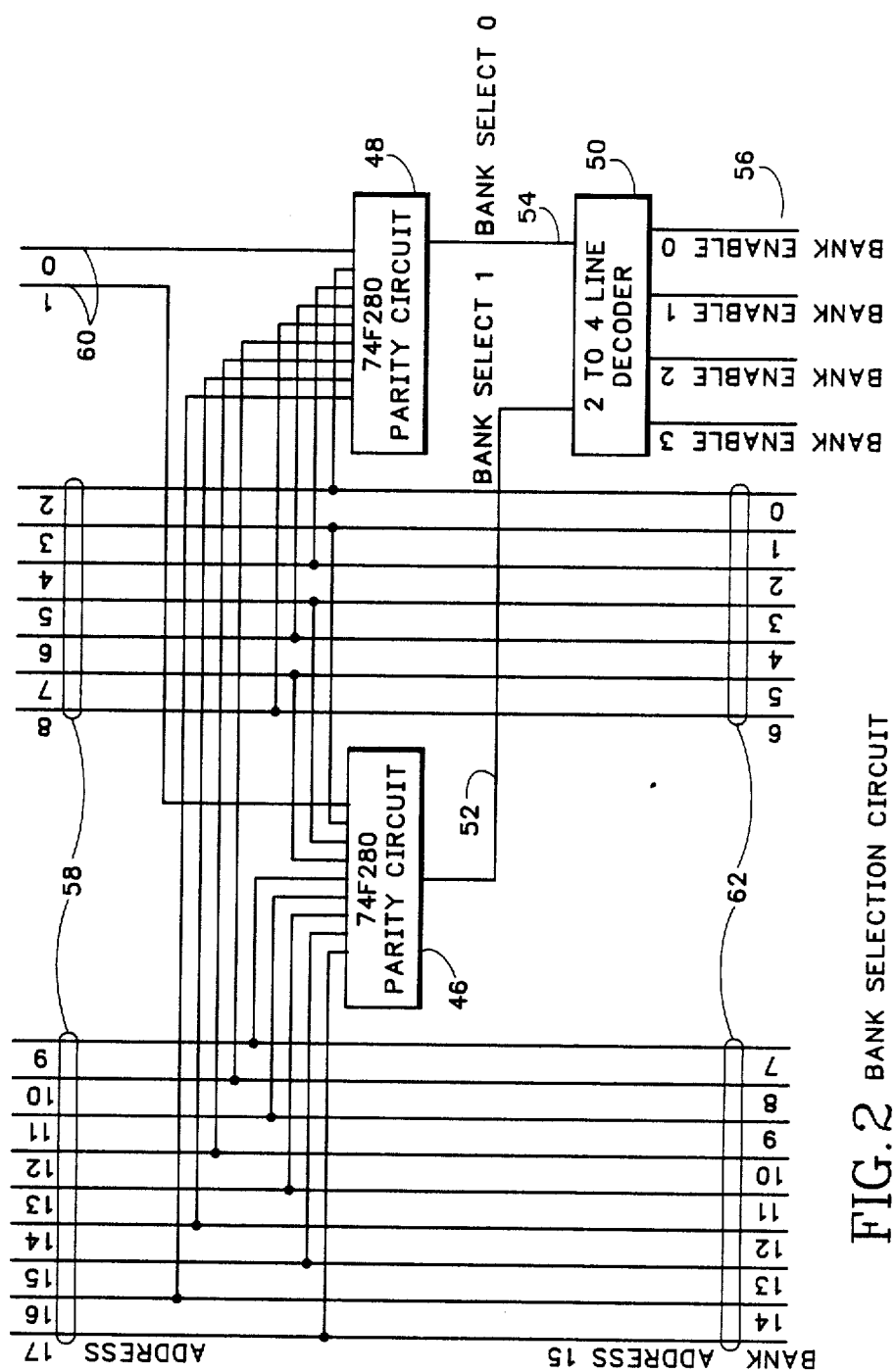
FIG. 2 BANK SELECTION CIRCUIT

INTERLEAVED MEMORY ADDRESSING SYSTEM AND METHOD USING A PARITY SIGNAL

BACKGROUND OF THE INVENTION

This invention relates to random access digital memories, and in particular to the use of interleaved memory bank selection to increase the efficiency of access to random access memory devices.

In digital computing, it is often desirable to access data sequentially from random access memory devices more rapidly than a single device, or set of devices, can respond. One solution to this problem is to partition the memory devices into sets, or "banks," of memory which may be independently selected for access and to arrange the memory addressing circuitry so that each numerically consecutive address is directed to a different memory bank. For example, the memory may be divided into four memory banks, the two least significant bits of the memory address being used to select one of the memory banks. Such an addressing system allows access to a new memory location in another memory bank to be initiated while a previously accessed memory bank completes its access cycle, thereby increasing the overall memory access speed.

A problem with the aforementioned approach is that an increment of consecutive addresses equal to the number of memory banks nevertheless accesses the same memory bank every time, and since powers of two are the most used address increments in digital computers, it is likely that the increments between consecutive addresses will frequently be equal to the number of memory banks.

An approach to solving the problem of faster interleaved memory bank selection is to use prime way interleaving. In this approach, the number of memory banks is set equal to a prime number, thereby decreasing the likelihood that power of two increments will cause sequential access to the same memory bank. However, the bank decoding logic for this approach is complex, which not only increases its expense, but tends to degrade the maximum achievable access speed performance. Moreover, consecutive address increments that are a multiple of the prime number of banks will also access the same bank consecutively.

A second approach which has been employed is to generate disorder in the selection of memory banks by using a lookup table to interleave the memory banks. That is, the memory address is provided to a read-only memory which stores a table that relates addresses to memory banks For a given memory address, a memory bank identification is stored such that the order with which the memory banks are selected changes as the memory address increases, up to some preselected memory address.

Some problems with the latter approach are that the table size is limited by the number of memory locations in the read-only memory; read-only memory devices are not fast enough to perform at the speed at which random access memory access may be required, e.g., 25 megaherts; and selection of the table in the memory has heretofore been done empirically.

Therefore, there has been a need for an improved memory bank interleaving mechanism for digital memory which increases the speed with which any sequence of memory locations may be accessed.

SUMMARY OF THE INVENTION

The present invention solves the aforementioned problems of prior memory bank interleaving while providing rapid sequential access to memory locations.

A multiple-bit digital address is provided for selection of a memory location within a plurality of random access memory banks. The appropriate memory bank is selected based upon the parity among a predetermined set of the address bits including the least significant address bit.

Where more than two memory banks are employed, as is typical, more than one of the least significant address bits are employed in respectively different combinations of address bits to produce respective parity signals. The combination of all parity signals is decoded to select the appropriate memory bank.

Preferably, each parity signal is produced by a parity signal generation logic circuit employing combinational or sequential logic.

Therefore, it is the principal objective of the present invention to provide an improved interleaved memory bank selection system and method.

It is a further objective of the present invention to provide an interleaved memory bank selection system and method which employs the parity among memory address bits to select a given memory bank.

The foregoing and other objectives, features and advantages of the present invention will be more readily understood upon consideration of the following detailed description of the invention, taken in conjunction with the accompanying drawings.

DESCRIPTION OF DRAWINGS

FIG. 2 shows a detailed block diagram of a preferred embodiment of an interleaved memory bank selection system according to the present invention.

DESCRIPTION OF A PREFERRED EMBODIMENT OF THE INVENTION

Figure 1:
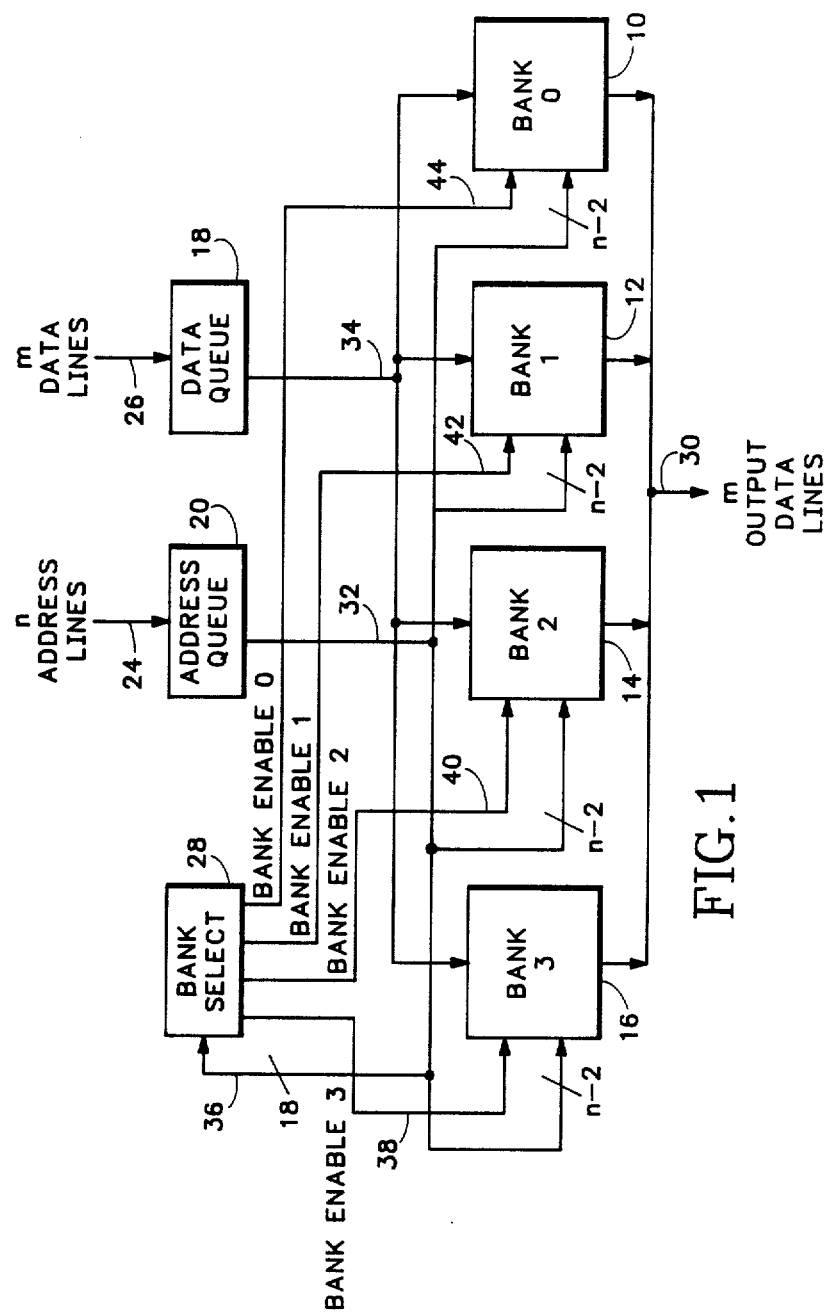
FIG. 1 shows a functional block diagram of a memory module which includes an interleaved memory bank selection system according to the present invention.

Referring first to FIG. 1, a plurality of random access memory banks 10, 12, 14, and 16 are connected in parallel to a single address queue 20, a single data input queue 18, and a bank selection mechanism 28. The address queue is connected to a predetermined number ("n") of digital address lines 24, and provides the same number of lines 32 to the memory banks 10, 12, 14, and 16 and to the bank select circuit 28. The data queue 18 is connected to a predetermined number ("m") of data input lines 26 and provides the same number of data lines 34 each of the four memory banks. The outputs of the four memory banks feed a number of output data lines 30. The address queue 20 and the data queue 18 provide a mechanism for temporarily storing memory requests that address a memory bank that is already busy. The bank selection circuit 28 converts the least significant 18 bits 36 of each memory address into one of four bank enable signals 38, 40, 42, and 44.

As shown in FIG. 2, a preferred embodiment of the bank selection circuit is comprised of two nine bit parity signal generator circuits 46, 48 and a standard 2 line to 4 line decoder circuit 50. Preferably, the parity signal generation circuit is a standard parity tree logic circuit as, for example a 74F280 integrated circuit. The memory address is provided by an address bus represented by address lines 58 and 60. Each parity circuit is connected to every other memory input address line such that parity circuit 48 generates add parity for the even numbered address bits and parity circuit 46 generates odd parity for the odd numbered address bits. Address bits 2 through 17, on address lines 58, are connected to the memory bank address inputs 0 through 15, shown by number 62, of all four memory banks. Input address bits 0 and 1, on address lines 60, are only connected to the parity circuits and are effectively replaced by the outputs 52, 54 of the parity circuits. The parity circuit outputs comprise a two bit code which represents the binary number of the bank addressed by the least significant 18 bits of the input address lines 58 and 60. The 2 line to 4 line decoder 50 decodes the parity circuit outputs 52, 54 to generate an enable signal 56 provided to one of four memory banks.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A system for addressing a plurality of banks of random-access memory devices, comprising:
   (a) means for providing a memory address having a predetermined number of address bits, greater than one;
   (b) means, responsive to a predetermined set of said address bits including the least significant bit, for producing a parity signal representative of the parity among said set of address bits; and
   (c) means, responsive to said parity signal, for selecting one of said banks of memory devices based upon said parity signal.

2. The system of claim 1 wherein said means for producing a parity signal comprises a parity generator having, as one input, said least significant address bit and, as another input, a predetermined selection of more significant address bits.

3. The system of claim 2 wherein said parity generator comprises a parity signal generation logic circuit.

4. The system of claim 3 wherein said means for selecting one of said banks of memory devices comprises decoder means for converting a binary digital signal to one of a plurality of signals corresponding respectively to said banks of memory devices.

5. A method for addressing a plurality of banks of random-access memory devices, comprising:
   (a) providing a memory address having a predetermined number of address bits, greater than one;
   (b) producing a parity signal representative of the parity among a predetermined set of said address bits including the least significant address bit; and
   (c) selecting one of said banks of memory devices based upon said parity signal.

* * * * *